(12) United States Patent
Jeong

(10) Patent No.: US 6,573,135 B2
(45) Date of Patent: Jun. 3, 2003

(54) SIMULTANEOUS FORMATION OF BOTTOM ELECTRODES AND THEIR RESPECTIVE OPENINGS OF CAPACITORS IN BOTH A MEMORY CELL REGION AND LOGIC REGION

(75) Inventor: Yong-Sik Jeong, Kyoungki-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/222,278

(22) Filed: Aug. 16, 2002

(65) Prior Publication Data

US 2003/0087491 A1 May 8, 2003

(30) Foreign Application Priority Data

Nov. 3, 2001 (KR) ........................................ 2001-68387

(51) Int. Cl.[7] ........................................ H01L 21/8242
(52) U.S. Cl. ...................................................... 438/239
(58) Field of Search ................................ 438/238, 239, 438/240, 250, 253, 254, 255, 257, 637, 675

(56) References Cited

U.S. PATENT DOCUMENTS 6,143,601 A  11/2000  Sun .............................. 438/253

*Primary Examiner*—Richard Elms
*Assistant Examiner*—Beth E. Owens
(74) *Attorney, Agent, or Firm*—Marshall, Gerstein & Borun

(57) ABSTRACT

A method for manufacturing a semiconductor device having a first capacitor in a memory cell region and a second capacitor in a logic region is described. The method includes the steps of: a) forming an interlayer insulating layer on a blanket substrate; b) simultaneously forming a first opening portion and a second opening portion for the first capacitor and the second capacitor, respectively, by selectively etching the interlayer insulating layer; c) simultaneously forming bottom electrodes of the first capacitor and the second capacitor by forming a conductive layer within the first opening portion and the second opening portion; d) forming a dielectric layer on the bottom electrodes of the first capacitor and the second capacitor; and e) forming top electrodes of the first capacitor and the second capacitor on the dielectric layer.

5 Claims, 12 Drawing Sheets

SIMULTANEOUS FORMATION OF BOTTOM ELECTRODES AND THEIR RESPECTIVE OPENINGS OF CAPACITORS IN BOTH A MEMORY CELL REGION AND LOGIC REGION

BACKGROUND

The disclosure relates to a method for manufacturing a semiconductor device and, more particularly, to a method for forming an analog capacitor and a cell capacitor simultaneously without an additional process.

BRIEF DESCRIPTION OF THE PRIOR ART

An excellent way to increase competitiveness in the semiconductor manufacturing industry is decreasing chip size by inducing a technology for fabricating fine structure in order to increase chip number per wafer, and at the same time increasing a production yield. In a dynamic random access memory (DRAM), these benefits may be obtained, but capacitance required by the DRAM unit cell is fixed, so to obtain adequate capacitance, the surface area of a cell capacitor may be secured.

As the size of the semiconductor device is minimized, two methods are introduced to secure cell capacitance. First, the height of the cell capacitor is extended to increase the surface area thereof. Second, a dielectric layer of the cell capacitor is formed of selected materials having high dielectric constant. A $Ta_2O_5$ layer and/or a BST($(Ba,Sr)TiO_3$) layer replace(s) a nitride layer, which is usually used as a dielectric layer.

Requirements, of the system on chip (SOC) structure have been strongly raised due to its various advantages. In particular, a technology realizing a memory device, such as DRAM, and a logic device within one chip is required, so merged DRAM with logic (MDL) and embedded DRAM with logic (EDL), etc. have been developed. Most logic circuits comprise an analog circuit and, especially, general usage of an analog capacitor has gradually been realized.

There have been numerous attempts to obtain capacitance required in the MDL. For example, the height of the capacitor may be extended, and hemispherical grains (HSG) may be formed on a surface of the charge storage electrode to increase the surface area of the capacitor. Also, electrodes of a capacitor may be formed with proper materials in order that the dielectric layer of the capacitor is formed with materials having high dielectric constants. In the case of $Ta_2O_5$, a metal insulator silicon (MIS) structure may be adopted, and in the case of other dielectric materials, such as BST, a metal insulator metal (MIM) structure may be adopted to form a capacitor.

In the tendency of manufacturing process to increase cell capacitance in the MDL, a cell capacitor having the MIM structure may be formed in a memory cell region, and an analog capacitor, of which electrodes and a dielectric layer are different from the cell capacitor, may be formed in a logic circuit region.

However, in such a process, the process complexity is increased because the cell capacitor and the analog capacitor are separately realized. Also, as the height of the cell capacitor is increased, the depth of the contact hole is consequently increased, and it is difficult to completely fill the contact hole.

Therefore, difficulties of manufacturing may be increased and lowering of reliability may occur. Moreover, Pt and Ru, which are representative materials for a capacitor electrode of a next generation DRAM, are expensive, so the materials may be effectively used, but in a conventional case, a cell capacitor and a logic capacitor are separately formed so that it is difficult to expect the effective usage of the materials.

FIGS. 1A to 1H are cross-sectional views illustrating a conventional semiconductor manufacturing process.

Referring to FIG. 1A, a well (not shown) and an isolation layer 13 of each of a cell region A and a logic region B are formed on a substrate 11, and a gate electrode 14 and a gate hard mask 15 are then formed on the substrate 11. The gate electrode 14 is formed from a polysilicon, a tungsten silicide, tungsten, or a combination thereof, and the gate hard mask 15 is formed of an oxide layer, a nitride layer, or a combination thereof. At this time, a logic gate is simultaneously formed in the logic region B. The logic gate has a polycide/capping layer structure and in some cases, the capping layer may be omitted.

Subsequently, a source/drain is formed using an ion injection method, etc., and a sidewall spacer 17 is formed on the gate electrode 14 and the gate hard mask 15. Concentrations of the source/drain of the cell region A and the logic region B may be different from one another. Also, a salicide process is carried out to decrease a resistance of the source/drain 16 and a contact to be formed. The sidewall spacer 17 is formed of an oxygen layer, a nitride layer, or a combination thereof.

An interlayer insulating layer 18 is formed on the resulting structure including the gate hard mask 15, and the interlayer insulating layer 18 is planarized.

Referring to FIG. 1B, a plurality of first plugs 19 of a cell region A, for example, a contact plug for storage node is formed using a polysilicon or a tungsten material, and an interlayer insulating layer 20 is deposited. Next, a bit line contact hole 21 is formed in a cell region A by selectively etching the interlayer insulating layer 20, and in a logic region B, a contact hole 22, which exposes the gate electrode 14 of the MOS transistor or the source/drain connection 16, and a metal wiring contact hole are formed.

Referring to FIG. 1C, plugs are subsequently formed, each of which is filled into the contact holes 21 and 22, respectively, for example, a bit line contact plug 23 and a MOS contact plug 24, and a bit line 25 is formed in a cell region A using a tungsten or a tungsten silicide material. Subsequently, metal wiring 26 is formed in the logic region B.

Interlayer insulating layers 27 and 28 are formed on an upper portion of the resulting structure of the bit line 25 and the metal wiring 26. In FIG. 1C, the interlayer insulating layer 27 for preventing oxidation and increasing adhesion of the bit line 25, may be omitted.

Referring to FIG. 1D, the interlayer insulating layers 27 and 28 of the cell region A are selectively etched to formed a contact hole, which exposes a surface of the first plug 19, and a second plug 29 is formed using a conductive material. The double plug forming technology is followed by a process to increase cell capacitance by increasing the height of a cell capacitor according to size minimization of the pattern.

Referring to FIG. 1E, an etching stopping layer 30 and an interlayer insulating layer 31 are successively deposited on the resulting structure including the second plug 29 and an interlayer insulating layer, and an opening portion within which a bottom electrode may be formed is formed by selectively etching an interlayer insulating layer of the cell region A and an etching stopping layer 30. The etching stopping layer 30 is used as a masking layer in a wet etching process, so according to the selected wet etchant, the used materials are changed; a nitride layer type of material is usually used.

A conductive layer is deposited on a bottom and side portions of the opening portion, and on the interlayer insulating layer 31 using materials for a bottom electrode, such as a polysilicon and tungsten materials. Subsequently, an interlayer insulating layer 33 for covering a conductive layer of bottom and side parts of the opening portion is formed, i.e., by forming the insulating layer on the resulting structure and removing it using an etch back to leave the insulting layer within the opening portion, and carrying out a chemical mechanical polishing (CMP) process with respect to a surface of the interlayer insulating layer 28 to form a bottom electrode 32. The insulating layer 33 prevents etching of a conductive layer forming the bottom electrode 32, and is formed with the SOG or an oxide layer, which is used in forming a field oxide layer.

Referring to FIG. 1F, the bottom electrode 32 is exposed by selectively removing the interlayer insulating layer 31 on the cell region A and an insulating layer, then forming a dielectric layer 34 and a top electrode 35. The dielectric layer 34 is usually formed with an oxide layer-type and a $Ta_2O_5$ layer.

Referring to FIG. 1G, the interlayer insulating layers 36 and 37 are deposited on an upper portion of a resulting structure including the top electrode 35, and metal wirings 39 and 40 are formed in the cell region A and the logic region B, respectively, by repeating an etching and depositing and an etching process, then in the logic region B, a bottom electrode 38 of a logic capacitor is formed. The bottom electrode 38 of the analog capacitor is formed with aluminum and/or a tungsten material.

A dielectric layer is deposited using an oxide layer, a nitride layer, or combination thereof, and a conductive layer, such as a TiN layer, is deposited, then a dielectric layer 41 of a logic capacitor and a top electrode 42 pattern are formed by etching the conductive layer and the dielectric layer. In this process, the dielectric layer is etched and removed in an outside region of an analog capacitor.

Next, referring to FIG. 1H, a post-process, such as forming interlayer insulating layers 43 and 45, and forming a metal wiring 44, is performed.

However, the conventional manufacturing process has the following problems.

First, when forming an electrode for a digital capacitor in the cell region A, the electrode material is deposited on the whole substrate and in a patterning process, and the electrode material deposited on a logic region is removed. Also, in forming a logic capacitor, an electrode material deposited on the cell region A may be removed. Therefore, due to a cost burden due to electrode material (precious metal) waste, a forming process of a cell capacitor may be performed with the MIS and/or the SIS structure, so processing is complicated, and because of process minimization, storage capacity reaches a limit.

Also, metal wiring is formed after completing the DRAM cell process, a contact hole depth of a contact hole is deepened, and the process to fill the depth is difficult. This problem is more serious if a pattern is minimized to a great extent.

Another problem is in forming an analog capacitor between metal wirings in a semiconductor device, such as in an MDL, i.e., the number of processes is increased and planarization of an interlayer insulating layer is difficult due to the increasing height experienced in forming an analog capacitor.

A technology used to form a cell region and a logic region is disclosed in U.S. Pat. No. 6,143,601, as follows.

Referring to FIG. 2A, a well and a separating layer 53 of a cell region A and a logic region B, respectively, are formed on a substrate, and patterned after depositing a gate electrode 54 and a gate hard mask 55. The gate electrode is formed with materials such as a polysilicon, a tungsten silicide, tungsten, or combination thereof, and the gate hard mask 55 is formed with an oxide layer, a nitride layer or combinations thereof.

Next, a source/drain connection 56 is formed using an ion injection method, and a sidewall spacer 57 is formed in the gate electrode 54 and the gate hard mask 55. In forming a source/drain connection 56, a concentration of the source/drain connection in a cell region A may be different from that of the source/drain connection in a logic region B. A salicide process may be adapted to decrease resistance of the source/drain connection 56 and post-contact resistance. Meanwhile, the sidewall spacer 57 is formed with an oxide layer, a nitride layer and a combination thereof.

Subsequently, an interlayer insulating layer 58 is formed on a resulting structure including the gate hard mask 55, and a planarization process is carried out. At this time, a logic gate is simultaneously formed. The logic gate has a polycide/capping structure, and the capping layer formation may be omitted.

A plug 59 and wiring 60 forming process is carried out to form a bit line contact/bit line in the cell region A, and metal wiring in the logic region B, that is, a local wiring contact/local wiring, simultaneously.

Referring to FIG. 2B, after depositing an interlayer insulating layer 61, an etching stopping layer 62 is formed using a nitride layer for a dual damascene process, and by patterning the etching stopping layer 62, a contact region, for example, in case of a cell region, a storage node contact, and in case of a logic region, a metal wiring contact are defined. Next, an interlayer insulating layer 63 is formed on the etching stopping layer 62 pattern and the interlayer insulating layer 61. At this time, the thickness of the interlayer insulating layer 63 is of the height of a bottom electrode of a capacitor, so it may be properly controlled.

Referring to FIG. 2C, a capacitor-forming region is defined by selectively etching an interlayer insulating layer 63 of a cell region A, and simultaneously defining a portion to be a metal contact by selectively etching an interlayer insulating layer 63, an etching stopping layer 62, and an interlayer insulating layer 61 of the logic region B.

After depositing materials for bottom electrode of a cell capacitor, such as a tungsten material, the CMP or an entire etching is carried out on a surface of a capacitor insulating layer 63 to form a bottom electrode 64 in a cell region and a plug 64, such as a tungsten material in the logic region B.

Referring to FIG. 2D, after depositing a dielectric layer 65 for a cell capacitor, the dielectric layer 65 remains in the cell region A where a cell capacitor may be formed; in other regions, the dielectric layer is removed using a photo etching process. The dielectric layer 65 is formed using materials such as $Ta_2O_5$ and/or BST.

Subsequently, a conductive layer is deposited and a photo-etching process is preferably used to form a capacitor top electrode 66 in the cell region A and wiring 66 is formed in the logic region B.

This second embodiment of a conventional method has more problems than that of the first embodiment of the conventional method, as described above.

First, materials are deposited for top electrode, and a top electrode is formed through blanket etching with proper design, but this method may not be possible in all cases. To form a MIS and/or a MIM cell capacitor and logic wiring at the same time, after depositing a dielectric layer for a cell capacitor, a photo-etching process including a dry etching is carried out. However, a photoresist and a plasma process are adapted in a capacitor dielectric layer, which may have good leakage characteristics, thereby generating deterioration in the characteristics.

Second, a cell storage node is formed when a bottom electrode is simultaneously formed, so it is difficult to fill a storage node with electrodes. This is more serious when a pattern is minimized, and a short circuit between a DRAM cell bit line and a storage node contact may occur.

Third, when a logic analog capacitor is formed by adapting this process, the number of processes is increased and, moreover, because of the topology of an analog capacitor, it is difficult to planarize an interlayer insulating layer.

SUMMARY OF THE DISCLOSURE

A method of semiconductor manufacturing is provided, which may operate at high speed and yield in a stable and simple way.

In accordance with one aspect of the disclosure, a method for manufacturing a semiconductor device having a first capacitor in a memory cell region and a second capacitor in a logic region is provided, wherein the method includes the steps of: a) forming an interlayer insulating layer on a blanket substrate; b) simultaneously forming a first opening portion and a second opening portion for the first capacitor and the second capacitor by selectively etching the interlayer insulating layer respectively; c) simultaneously forming bottom electrodes of the first capacitor and the second capacitor, by forming a conductive layer within the first opening portion and the second opening portion; d) forming a dielectric layer on the bottom electrodes of the first capacitor and the second capacitor; and e) forming top electrodes of the first capacitor and the second capacitor on the dielectric layer.

In accordance with another aspect of the disclosure, a method for manufacturing a semiconductor device having a first capacitor in a memory cell region and a second capacitor in a logic region is provided, wherein the method includes the steps of: a) forming a first interlayer insulating layer; b) forming an etching stopping layer on the first interlayer insulating layer in the second capacitor region; c) forming a second interlayer insulating layer covering the first interlayer insulating layer and the etching stopping layer; d) forming a first opening portion for the first capacitor by etching the second interlayer insulating layer of the memory cell region and the first interlayer insulating layer, and at the same time, forming a second opening portion for the second capacitor by etching the second interlayer insulating layer on the etching stopping layer; e) simultaneously forming bottom electrodes of the first capacitor and the second capacitor, by forming a conductive layer within the first opening portion and the second opening portion; f) forming a dielectric layer on the bottom electrodes of the first capacitor and the second capacitor; and g) forming top electrodes of the first capacitor and the second capacitor on the dielectric layer.

BRIEF DESCRIPTION OF THE DRAWINGS

Other objects and aspects of the disclosure will become apparent from the following description with reference to the accompanying drawings, in which.

DETAILED DESCRIPTION

A method of semiconductor manufacturing process will be described in detail referring to the accompanying drawings.

The disclosed method is applicable to the manufacture of a dynamic random access memory (DRAM), a merged DRAM with logic (MDL), and an embedded DRAM with logic (EDL), for example.

Figure 1A:
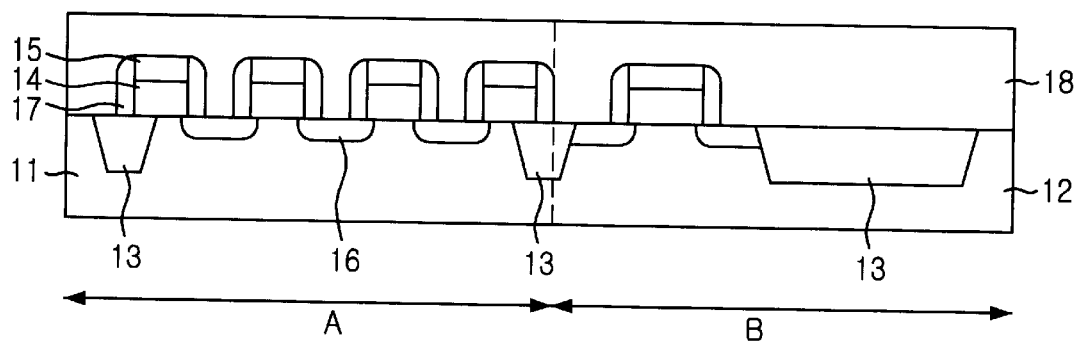
FIGS. 1A to 1H are cross-sectional views illustrating a first example of a conventional method of a semiconductor manufacturing process.
Figure 1B:
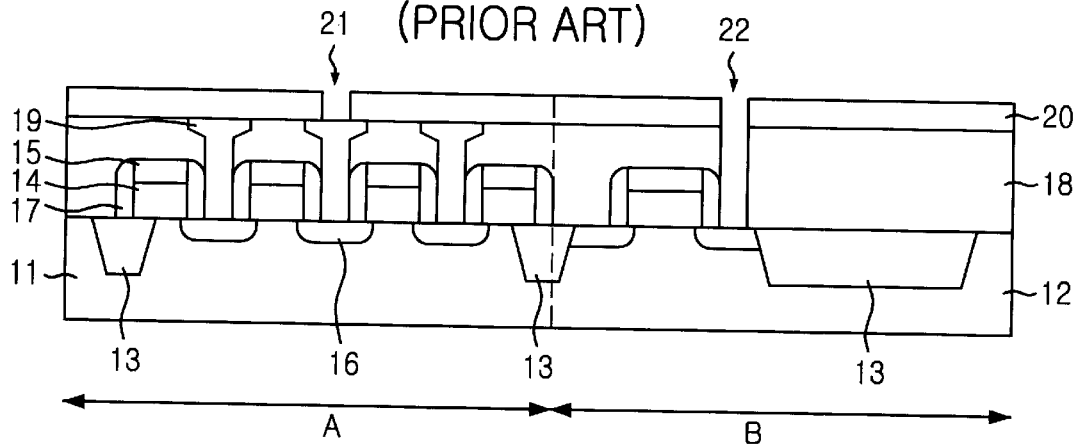
Figure 1C:
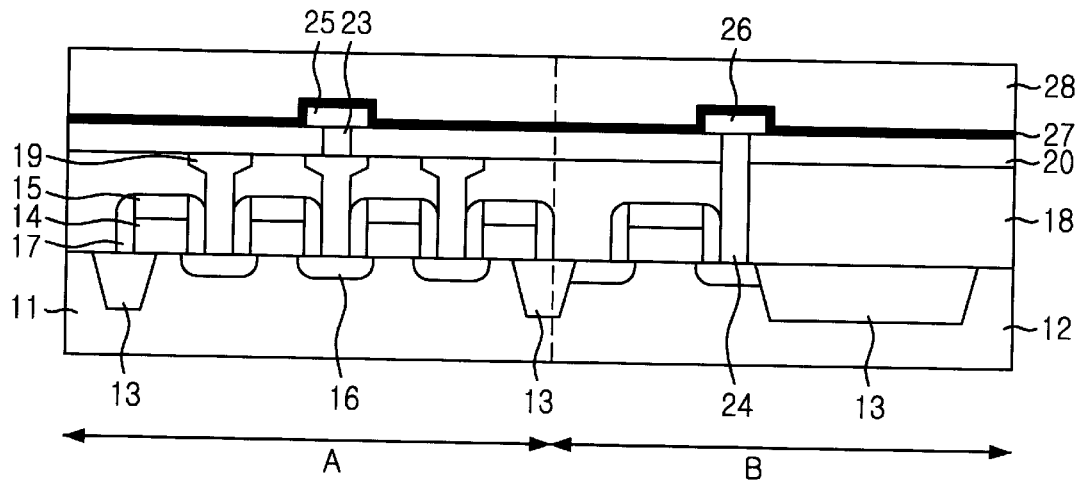
Figure 1D:
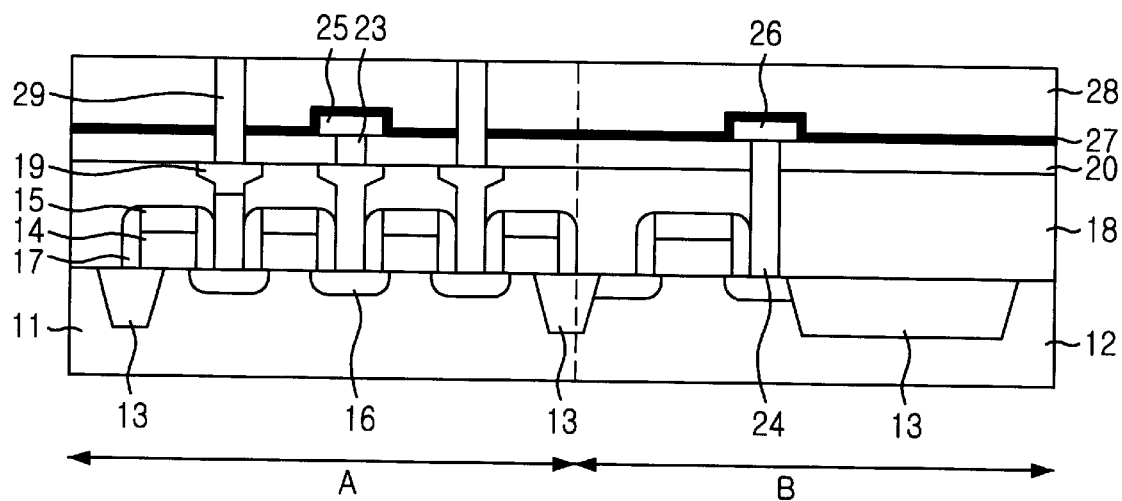
Figure 1E:
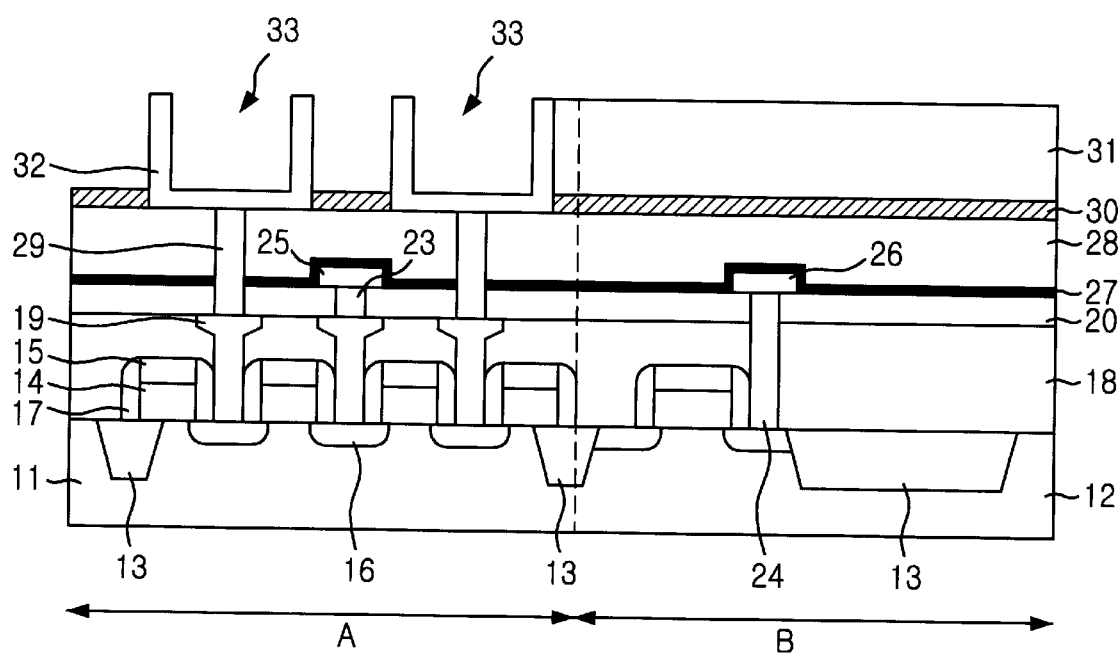
Figure 1F:
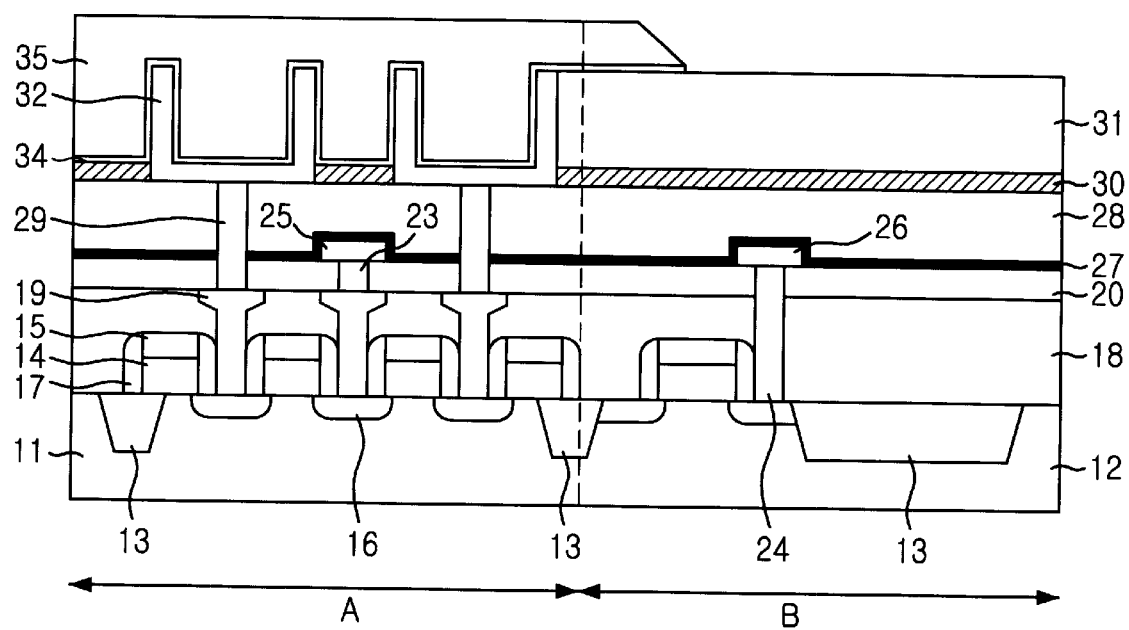
Figure 1G:
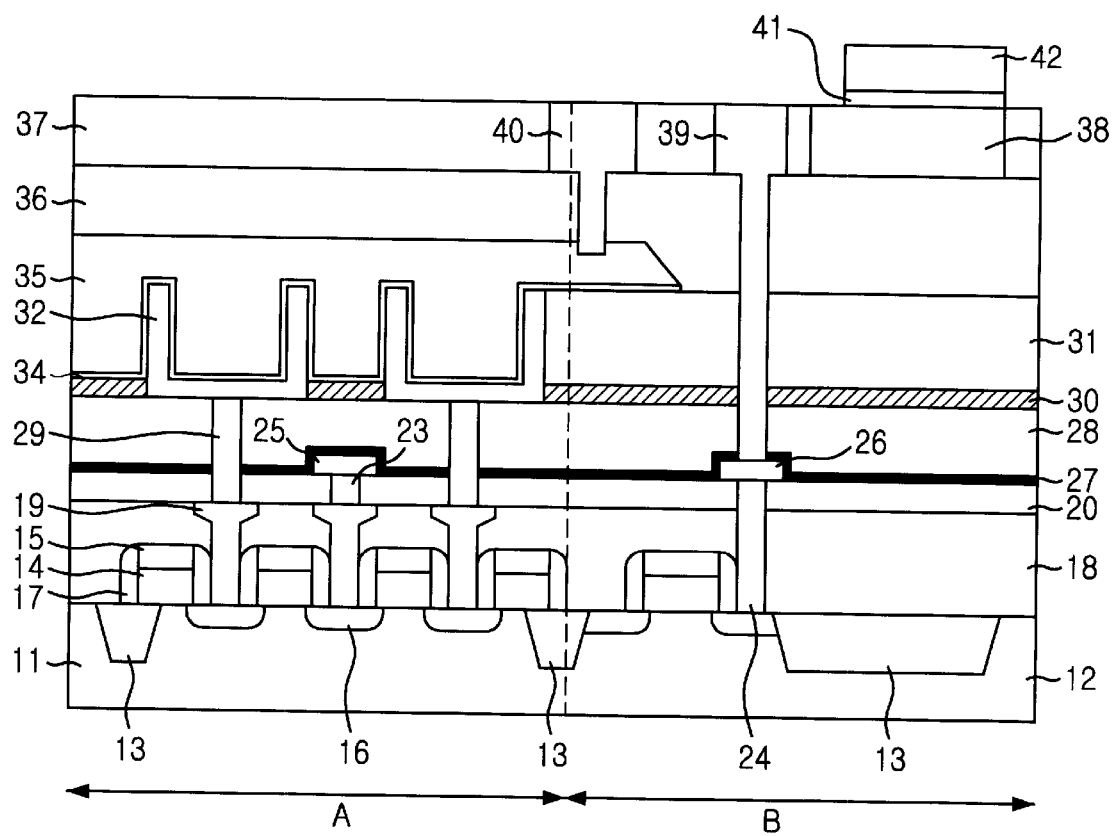
Figure 1H:
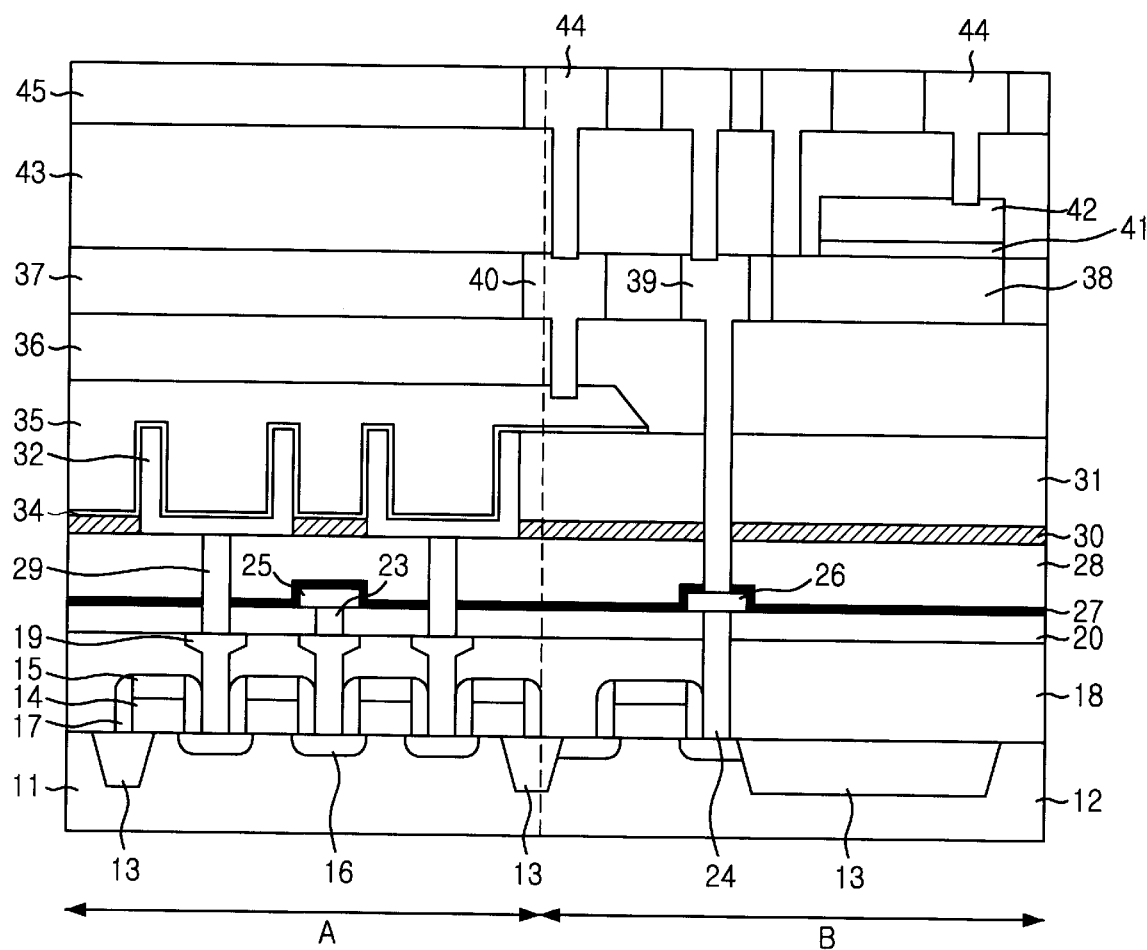
Figure 2A:
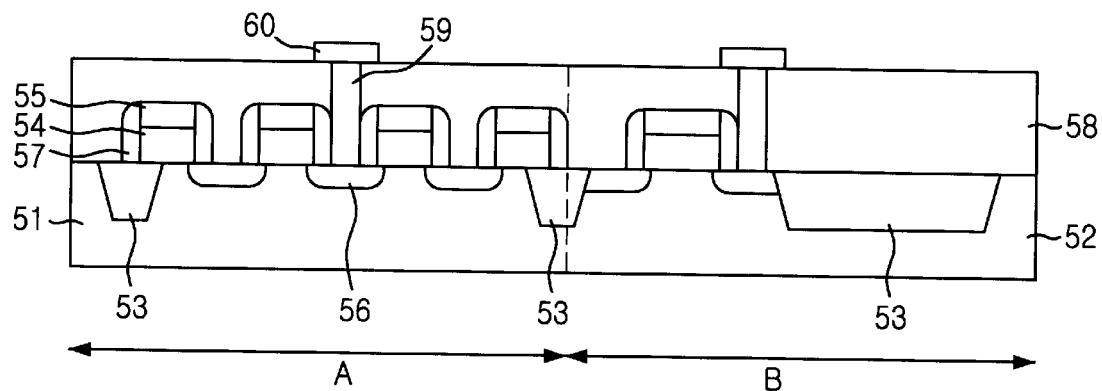
FIGS. 2A to 2D are cross-sectional views showing a second example of a conventional method of a semiconductor manufacturing process.
Figure 2B:
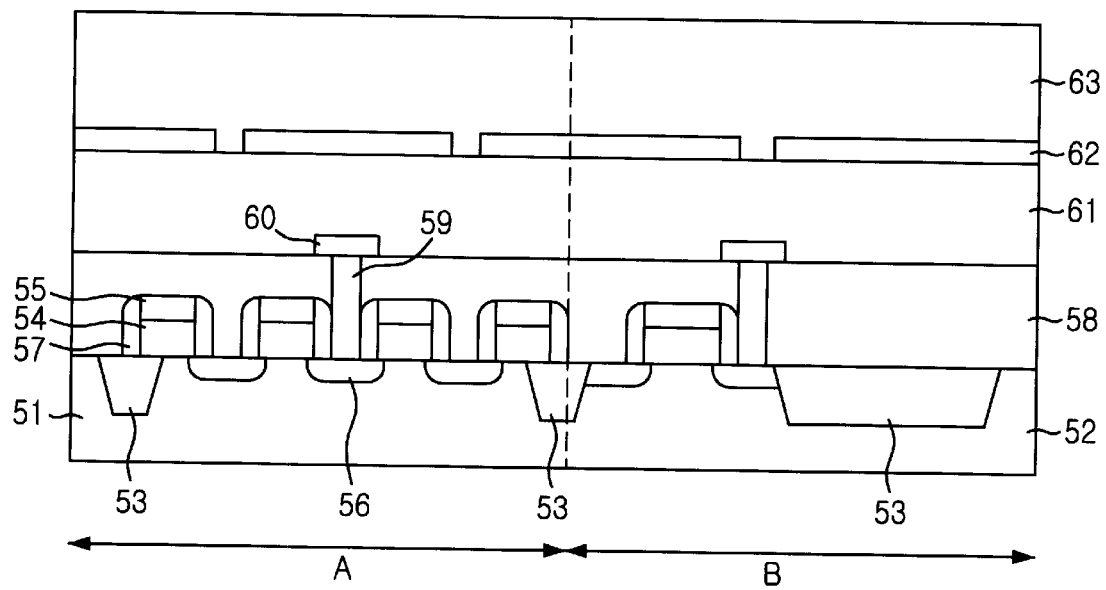
Figure 2C:
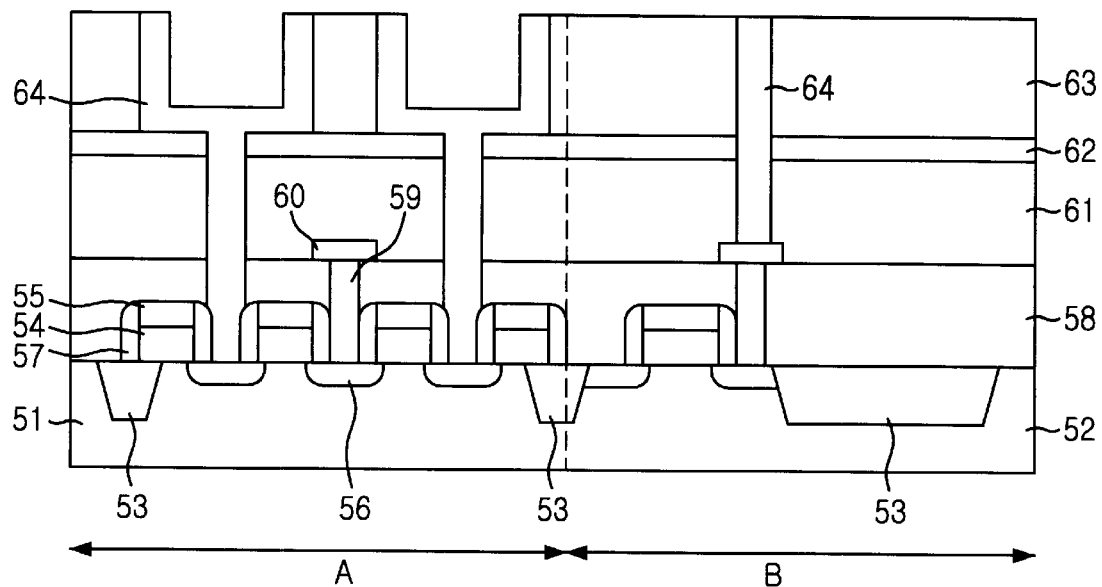
Figure 2D:
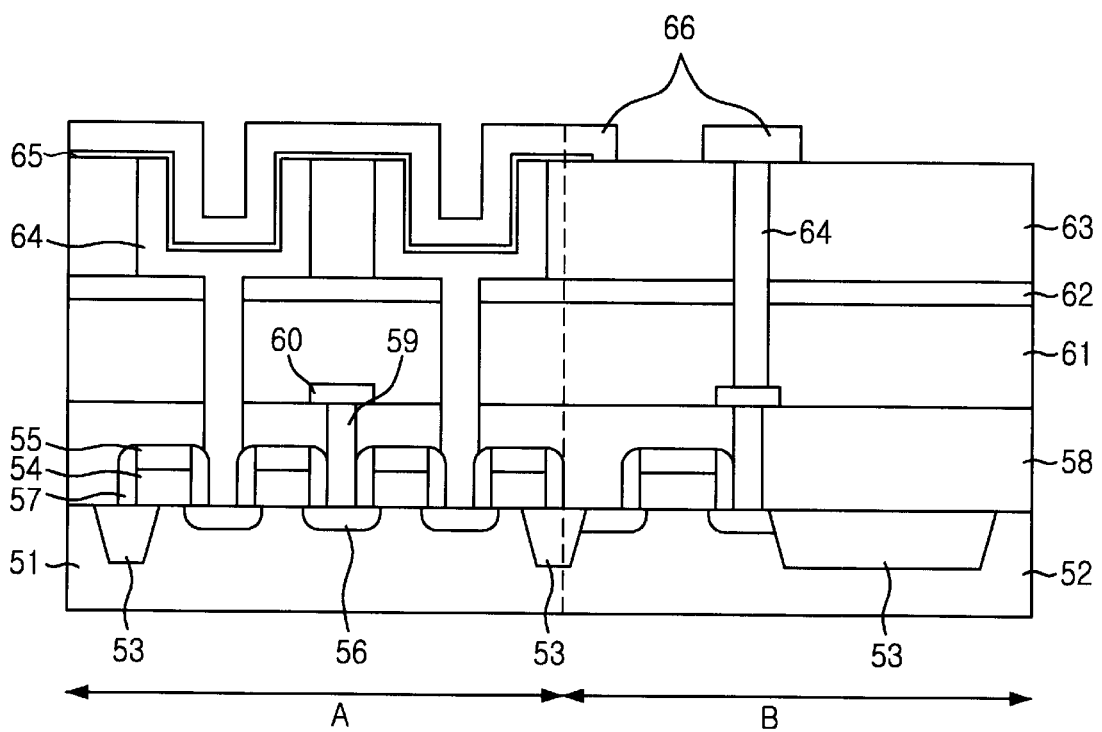
Figure 3A:
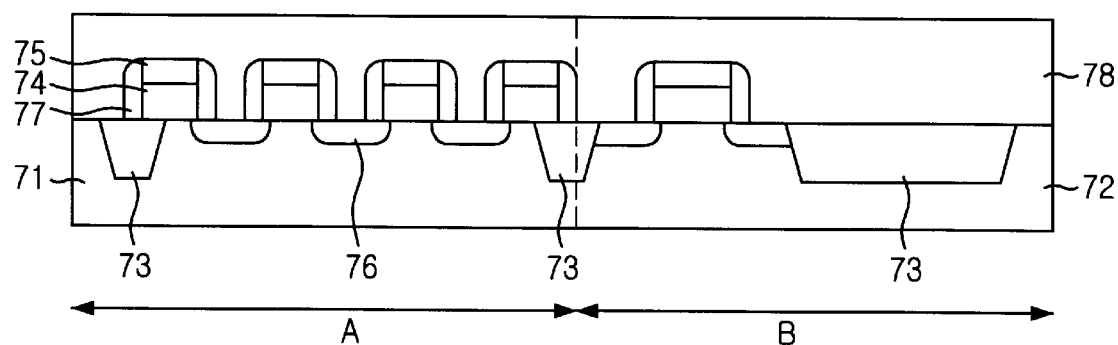
FIGS. 3A to 3H are cross-sectional views showing a method of a semiconductor manufacturing process in accordance with the disclosure.

Referring to FIG. 3A, a well and a separating layer 73 of a cell region A, such as DRAM and a logic region B, respectively, are formed on a substrate, and then a gate electrode 74 and a gate hard mask 75 are patterned and deposited. The gate electrode 74 is formed with materials such as polysilicons, tungsten silicides, tungsten, or combinations thereof, and the gate hard mask 75 is formed with an oxide layer, a nitride layer, or a combination thereof.

A source/drain connection 76 is formed through ion injection, and a sidewall spacer 77 is formed in the gate electrode 74 and the gate hard mask 75. In the source/drain connection forming process, sometimes concentration of the source/drain connection 76 in a cell region and a logic region is differentiated. Meanwhile, to decrease contact resistance followed by the source/drain 76 resistance and post-process, a salicide process may be carried out. The sidewall spacer is formed with an oxygen layer, a nitride layer, or a combination thereof.

A first interlayer insulating layer 78 is deposited on a top portion of resulting structure including the gate hard mask 75, and a planarization process may be carried out. To omit the planarization process, the first interlayer insulating layer 78 may be formed by using a mobility oxide type having good self planarization characteristic or the SOG.

Figure 3B:
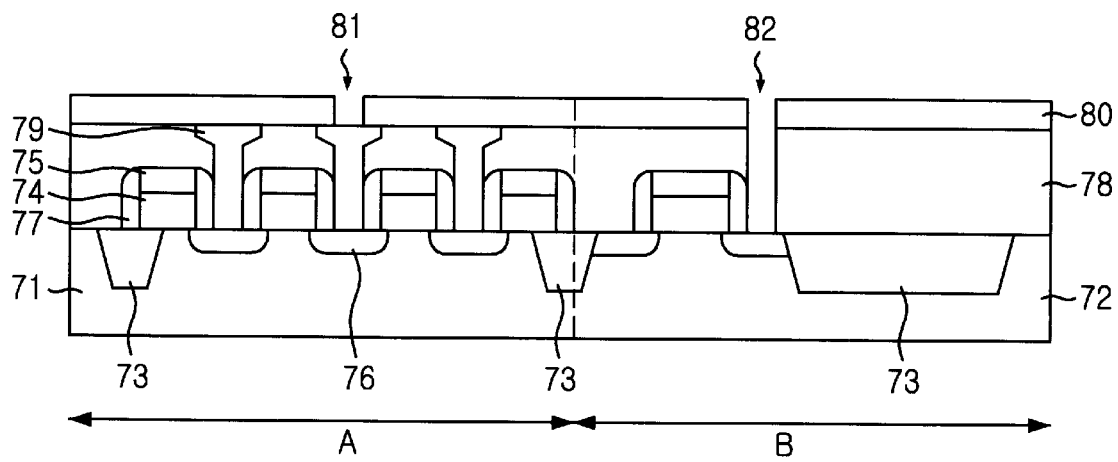

Referring to FIG. 3B, a plug 79 contacting the source/drain connection 76, that is a conductive region of a cell region by penetrating the interlayer insulating layer 78, for example, a contact plug for a storage node is formed using a polysilicon or tungsten material.

Subsequently, a bit line contact hole 81 is formed in a cell region 71 by selectively etching and depositing an interlayer insulating layer 80, and at the same time, a conductive region, that is a contact hole 82, which exposes the gate electrode 74 of MOS or the source/drain connection 76, is formed.

Figure 3C:
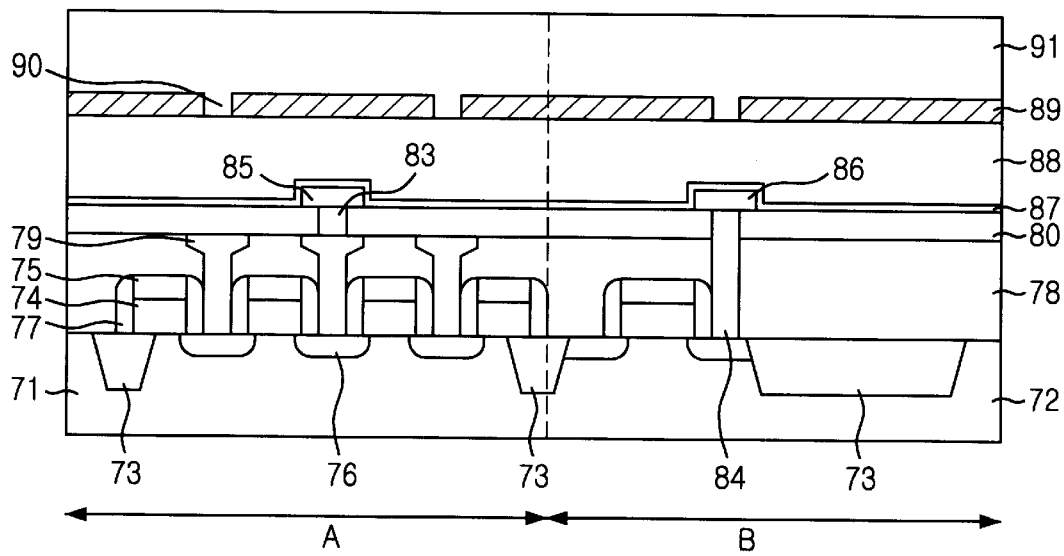

Referring to FIG. 3C, plugs are formed on the contact holes 81 and 82, respectively, for example, a bit line contact plug 83 is formed within the cell region, and a MOS contact plug 84 is formed in the logic region. After that, a bit line 85 is formed in the cell region 71 using materials such as tungsten or tungsten silicide, and metal wiring is formed in the logic region 72. It is not shown in the figure, but the metal wiring 86 may be formed in a cell region.

Next, interlayer insulating layers 87 and 88 are formed on an upper portion of a resulting structure where the bit line 85 and the metal wiring 86 are formed. In FIG. 3C, the layer 87 prevents oxidation and increases cohesiveness, and may be omitted.

Subsequently, after depositing an etching stopping layer 89, an etching stopping layer 89 pattern, which exposes an interlayer insulating layer 88 on a top portion of a contact region, is formed by selectively etching the etching stopping layer 89. An interlayer insulating layer 91 is formed on the resulting structure. In the case of a cell region, the contact region is a cell capacitor bottom electrode contact part, and in case of a logic region, it is a metal contact part. The etching stopping layer 89 is used as a masking layer in a post wet etching process, and is a different composition of an wet etching, and is usually formed with a nitride layer.

Figure 3D:
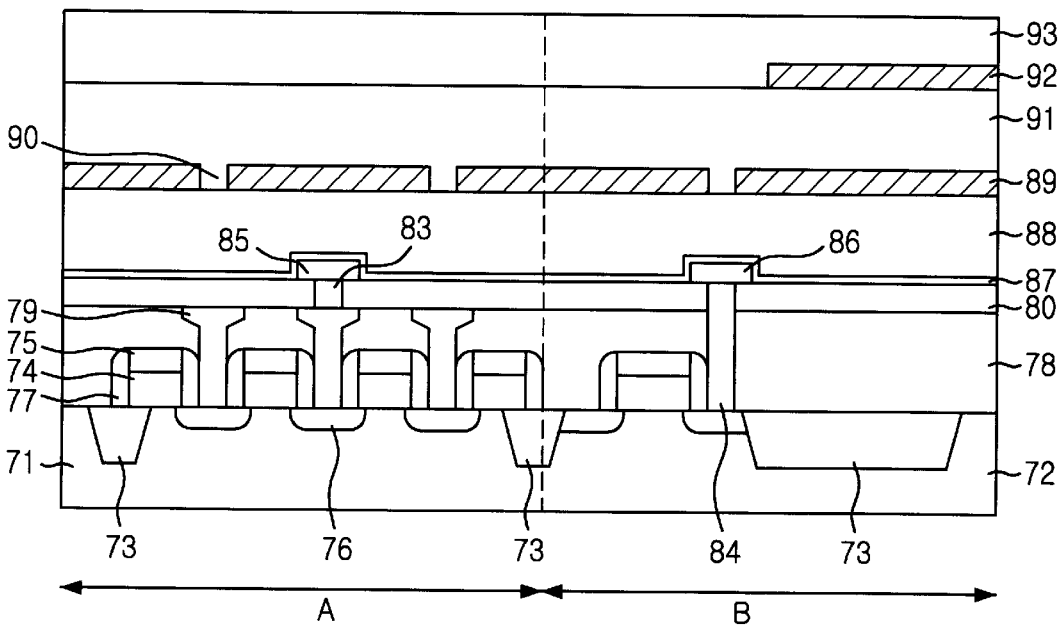

Referring to FIG. 3D, an etching stopping layer 92 pattern to cover a logic capacitor region is formed by depositing and selectively etching an etching stopping layer 92. Next, an interlayer insulating layer 93 is formed. The thickness of the interlayer insulating layer 93 is of the height of a logic capacitor bottom electrode, and the thickness of the interlayer insulating layer 91 plus the thickness of the interlayer insulating layer 93 is of the height of a cell capacitor bottom electrode.

Figure 3E:
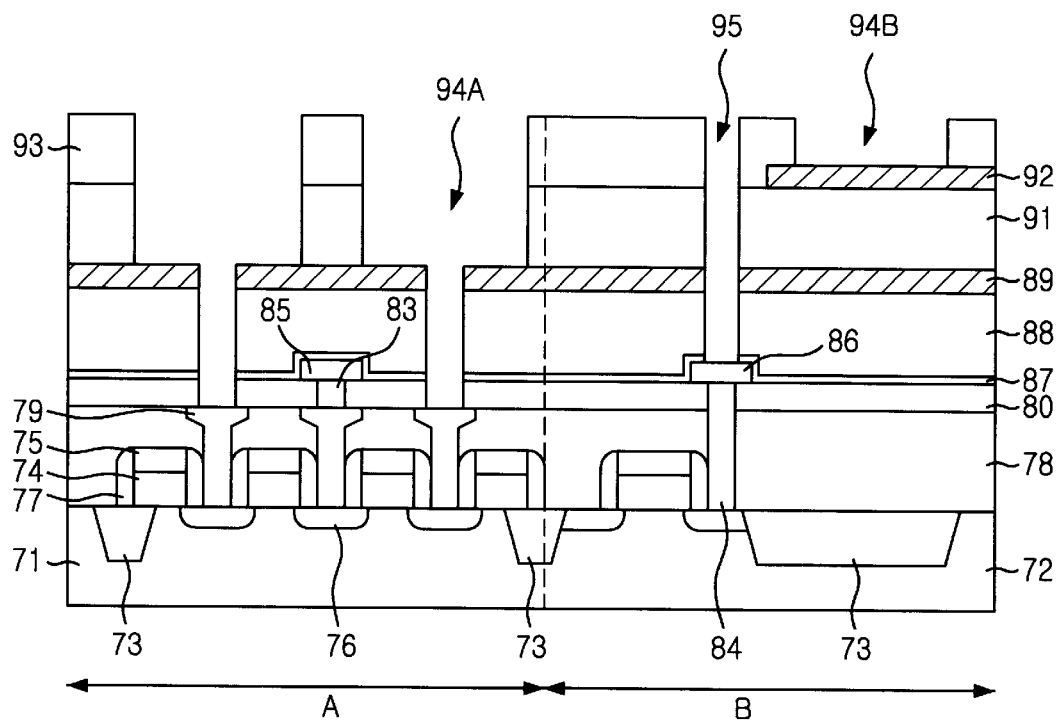

Referring to FIG. 3E, interlayer insulating layers 93, 91, 88, 87, and 80 are selectively etched using an etching mask (not shown), which defines a cell capacitor region, a logic capacitor region, and a metal wiring contact region. At this time, the etching barrier layers 89 and 92 act as a masking layer, and in the cell region A, a bottom region 94A of a cell capacitor is formed by selectively etching the interlayer insulating layers 93, 91, 88, 87, and 80, covering the plug 79, which may be connected to a bottom electrode of a cell capacitor. In the logic region B, a bottom electrode region 94B of a logic capacitor is formed by etching an interlayer insulating layer 93, which covers an etching stopping layer 92 pattern. A metal wiring region 95 is formed by selectively etching interlayer insulating layers 93, 91, 88, and 87, which cover metal wiring 86 of the cell region A and the logic region B. Meanwhile, the metal wiring region (not shown) may be formed in a cell region A.

Figure 3F:
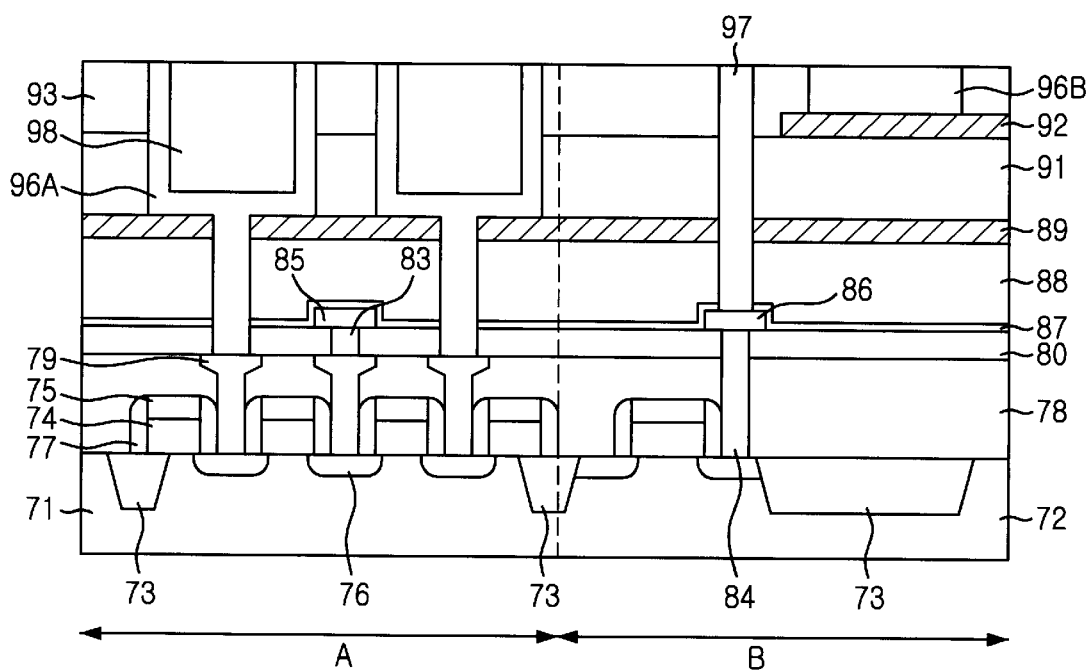

Referring to FIG. 3F, a conductive layer is deposited by separating or combining materials, such as a Pt, Ir, Ru, or an oxidized substance on a resulting structure, and an interlayer insulating layer pattern 98, which covers a conductive layer of a cell capacitor bottom electrode region, is formed with a material such as SOG, etc. The cell capacitor bottom electrode 96A is formed in the cell region A by removing a conductive layer using the etch back or the CMP until a surface of the interlayer insulating layer 98 is exposed, and at the same time, a logic capacitor bottom electrode 96B and the metal wiring 97 are formed in the logic region B. Meanwhile, before depositing the conductive layer, in the contact part of the plug 79 and a cell capacitor bottom electrode a TiN layer, a TaN layer and/or a ZrN layer may be formed to increase diffusion barrier characteristics.

Figure 3G:
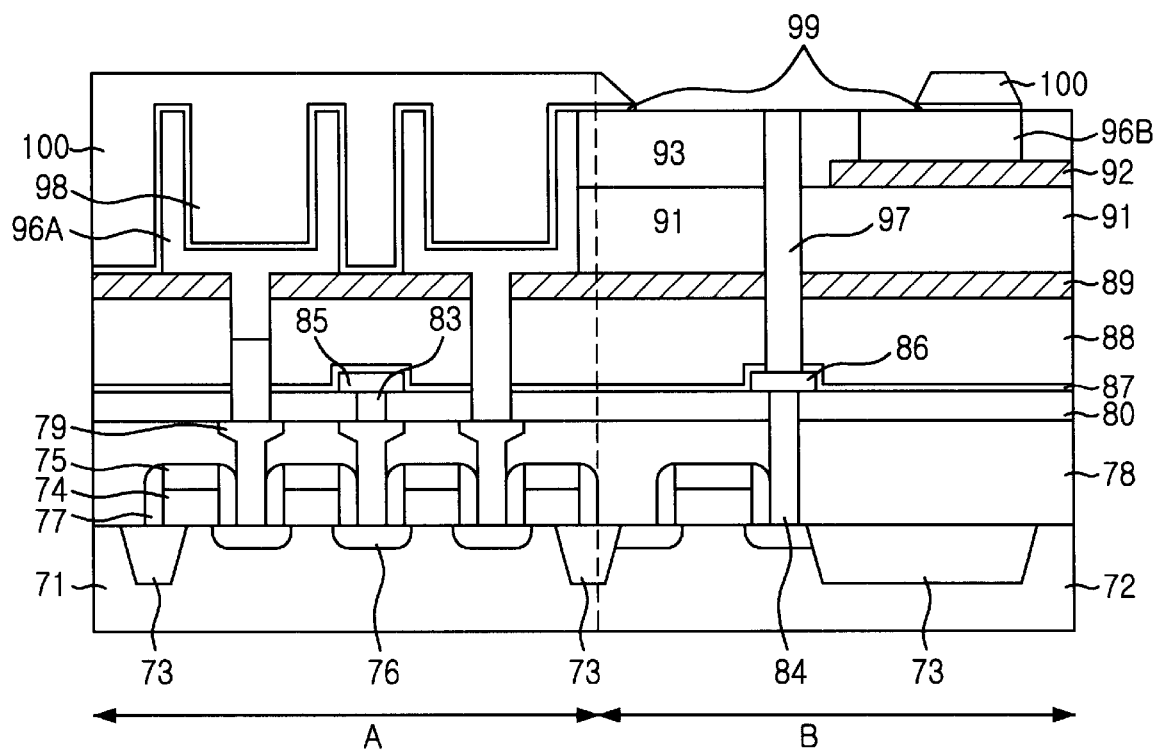

Referring to FIG. 3G, a cell capacitor and a dielectric layer 99 for a logic capacitor are formed with a BST layer, a PZT layer, a SBT layer and/or a Ta$_2$O$_5$ layer, and then patterned and deposited a conductive layer for a top electrode is to form top electrodes 100 of a cell capacitor and a logic capacitor, respectively.

Figure 3H:
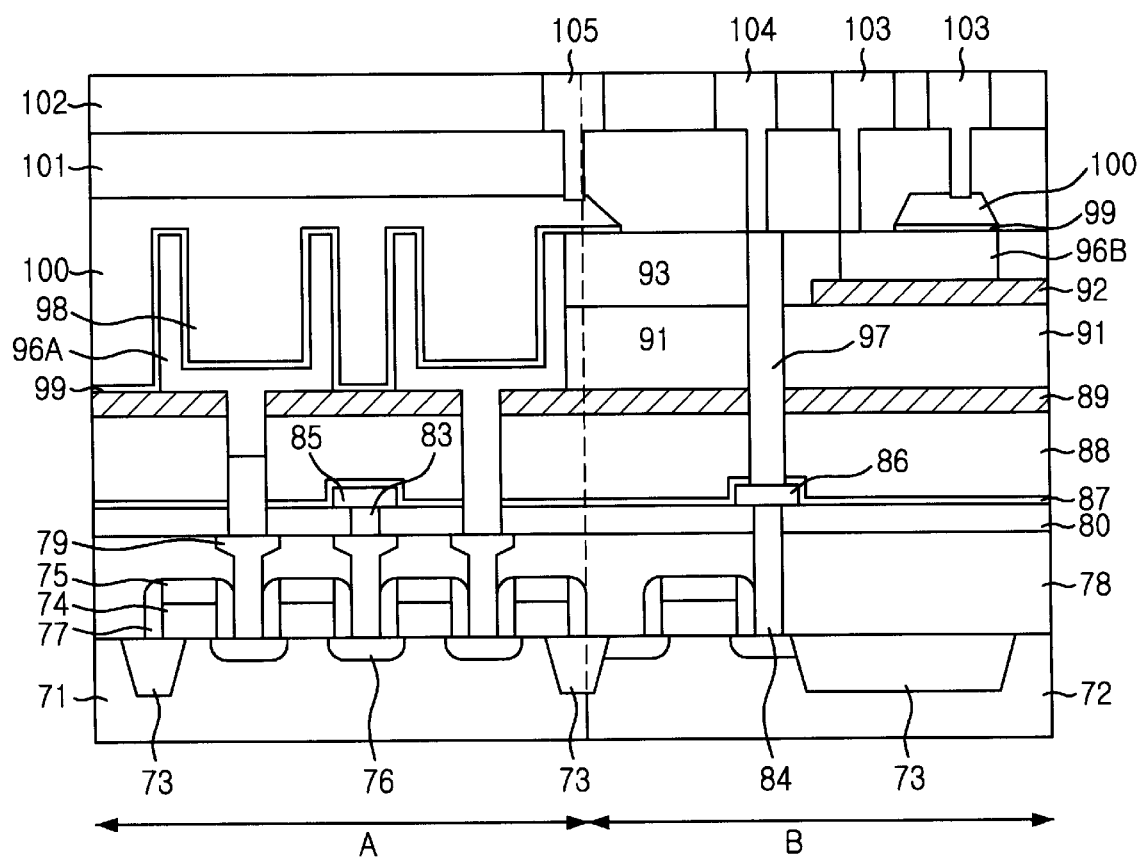

Referring to FIG. 3H, interlayer insulating layers 101 and 102 are successively deposited on a resulting structure, and the interlayer insulating layers 101 and 102 are selectively etched to form contact holes exposing a top electrode of a cell capacitor, bottom and top electrodes of a logic capacitor, and metal wiring 97. Subsequently, conductive materials, such as Al, W, and/or Cu, are deposited and patterned to form metal wiring 103 connected to bottom and top electrodes of a logic capacitor, respectively. Finally, metal wiring 104 connected to the metal wiring 97 and a metal wiring 105 connected to a top electrode of a cell capacitor is formed.

The disclosed method has the following advantages. First, in a cell, such as DRAM, etc., a cell capacitor structure with MIM structure may be adapted, so high-k formation is not difficult and the capacitance of a cell capacitor may be increased. Also, difficulties of etching may be solved by forming a bottom electrode with a damascene method. Additionally, the metal contact of a logic region may be formed when forming a bottom electrode of a DRAM cell, so a conductive layer may be easily filled within a contact of a logic region, and more safe process management and yield increasing may be expected. Moreover, a logic capacitor is formed in a cell capacitor forming process without an additional process, thereby performing a process easily, and a topology increase due to an additional logic capacitor formation may be prevented.

The method realizes three-dimensional aspects of a MIM capacitor to make it possible to materialize next generation Giga-bit DRAM structures. Especially, in DRAM mixed chip manufacturing, a logic capacitor and a cell capacitor of a DRAM are formed to a MIM structure, simultaneously, so the manufacturing process is simplified, and cost is decreased and a post process is stabilized.

What is claimed is:

1. A method for manufacturing a semiconductor device having a first capacitor in a memory cell region and a second capacitor in a logic region, comprising the steps of:
   a) forming an interlayer insulating layer on a blanket substrate;
   b) simultaneously forming a first opening portion and a second opening portion for the first capacitor and the second capacitor, respectively, by selectively etching the interlayer insulating layer;
   c) simultaneously forming bottom electrodes of the first capacitor and the second capacitor, by forming a conductive layer within the first opening portion and the second opening portion;
   d) forming a dielectric layer on the bottom electrodes of the first capacitor and the second capacitor; and
   e) forming top electrodes of the first capacitor and the second capacitor on the dielectric layer.

2. The method of claim 1, wherein the first opening portion is larger than the second opening portion.

3. The method of claim 2, wherein step c) includes the steps of:
   c1) forming the conductive layer on the interlayer insulating layer including the first opening portion and the second opening portion;
   c2) forming an insulating layer pattern covering the conductive layer of the first opening portion; and
   c3) forming a bottom electrode of the first capacitor within the first opening portion by removing the conductive layer until the surface of the interlayer insulating layer is exposed, and forming a bottom electrode of the second capacitor within the second opening portion.

4. A method for manufacturing a semiconductor device having a first capacitor in a memory cell region and a second capacitor in a logic region, comprising the steps of:
   a) forming a first interlayer insulating layer;
   b) forming an etching stopping layer on the first interlayer insulating layer in the second capacitor region;
   c) forming a second interlayer insulating layer covering the first interlayer insulating layer and the etching stopping layer;

d) forming a first opening portion for the first capacitor by etching the second interlayer insulating layer and the first interlayer insulating layer of the memory cell region, and simultaneously, forming a second opening portion for the second capacitor by etching the second interlayer insulating layer on the etching stopping layer in the logic region;

e) simultaneously forming bottom electrodes of the first capacitor and the second capacitor by forming a conductive layer within the first opening portion and the second opening portion;

f) forming a dielectric layer on the bottom electrodes of the first capacitor and the second capacitor; and g) forming top electrodes of the first capacitor and the second capacitor on the dielectric layer.

5. The method of claim 4, wherein step e) includes the steps of:

e1) forming the conductive layer on the second interlayer insulating layer including the first opening portion and the second portion;

e2) forming an insulating layer pattern covering the conductive layer of the first opening portion; and e3) forming a bottom electrode of the first capacitor within the first opening portion by removing the conductive layer until the surface of the second interlayer insulating layer is exposed, and forming a bottom electrode of the second capacitor within the second opening portion.

* * * * *